(12) United States Patent
Izawa (10) Patent No.: US 12,240,388 B2
(45) Date of Patent: Mar. 4, 2025

(54) COMPOUND WIRE HARNESS

(71) Applicant: SUMITOMO WIRING SYSTEMS, LTD., Yokkaichi (JP)

(72) Inventor: Katsutoshi Izawa, Yokkaichi (JP)

(73) Assignee: SUMITOMO WIRING SYSTEMS, LTD., Mie (JP)

( * ) Notice: Subject to any disclaimer, the term of this patent is extended or adjusted under 35 U.S.C. 154(b) by 29 days.

(21) Appl. No.: 18/277,416

(22) PCT Filed: Feb. 18, 2022

(86) PCT No.: PCT/JP2022/006592
§ 371 (c)(1),
(2) Date: Aug. 16, 2023

(87) PCT Pub. No.: WO2022/185948
PCT Pub. Date: Sep. 9, 2022

(65) Prior Publication Data
US 2024/0123919 A1    Apr. 18, 2024

(30) Foreign Application Priority Data

Mar. 4, 2021    (JP) .................................. 2021-034233

(51) Int. Cl.
*B60R 16/02*    (2006.01)
*H01B 7/17*    (2006.01)
*H05K 9/00*    (2006.01)

(52) U.S. Cl.
CPC ...... *B60R 16/0207* (2013.01); *B60R 16/0215* (2013.01); *H01B 7/17* (2013.01); *H05K 9/0098* (2013.01)

(58) Field of Classification Search
CPC . B60R 16/02; B60R 16/0207; B60R 16/0215; H01B 7/17; H01B 7/0045; H01R 13/6581; H05K 9/0098
See application file for complete search history.

(56) References Cited

U.S. PATENT DOCUMENTS

| | | | |
|---|---|---|---|
| 9,991,026 B2 | 6/2018 | Kanagawa | |
| 10,965,066 B2* | 3/2021 | Müller | H01R 13/6474 |
| 2003/0008555 A1* | 1/2003 | Obata | H01R 13/6582 |
| | | | 439/578 |
| 2012/0040557 A1* | 2/2012 | Marsh | H01R 9/0518 |
| | | | 439/585 |

FOREIGN PATENT DOCUMENTS

| | | |
|---|---|---|
| JP | H04-85677 U | 7/1992 |
| JP | 2006-310126 A | 11/2006 |

OTHER PUBLICATIONS

Jul. 27, 2022 International Search Report issued in International Patent Application No. PCT/JP2022/006592.

* cited by examiner

*Primary Examiner* — Paresh Paghadal
(74) *Attorney, Agent, or Firm* — Oliff PLC (57) ABSTRACT

A compound wire harness for installation in a vehicle, the compound wire harness including: a first wire harness; and a second wire harness configured to be electrically connected to an in-vehicle device and electrically connected to the first wire harness, wherein: the first exterior ring and the shield have a higher rigidity than the second exterior ring, the first connector housing is surrounded by the first exterior ring and the shield, and the shield is inseparably integrated with the shield shell.

9 Claims, 6 Drawing Sheets

COMPOUND WIRE HARNESS

BACKGROUND

The present disclosure relates to a compound wire harness.

Conventionally, a wire harness for use in a vehicle such as a hybrid vehicle or an electric automobile includes a wire member that electrically connects electrical devices such as a high-voltage battery and an inverter (see JP 6048859B, for example). This type of wire member includes a rigid wire, which is constituted by a core wire composed of a single conductor surrounded by an insulated coating, and flexible wires that are connected to the two ends of the rigid wire and are each constituted by a flexible core wire such as a stranded wire surrounded by an insulating coating.

SUMMARY

In the above-described wire harness, there is desire for an improvement in transport efficiency.

An exemplary aspect of the disclosure provides a compound wire harness that can achieve an improvement in transport efficiency.

A compound wire harness according to an aspect of the present disclosure is a compound wire harness for installation in a vehicle, the compound wire harness including a first wire harness; and a second wire harness configured to be electrically connected to an in-vehicle device and electrically connected to the first wire harness, wherein: the first wire harness includes: a first wire including a first core wire and a first insulating coating covering the first core wire; a first terminal attached to an end of the first core wire; a first connector housing covering the first core wire, the first insulating coating, and the first terminal; a first exterior ring that is ring-shaped and surrounds the first wire; and a shield that is ring-shaped and electrically conductive, and is attached to a lengthwise end of the first exterior ring, the second wire harness includes: a second wire including a second core wire and a second insulating coating covering the second core wire; a second terminal attached to an end of the second core wire and configured to be electrically connected to the first terminal; a second connector housing holding the second terminal; a shield shell that is ring-shaped and electrically conductive, and surrounds the second connector housing; and a second exterior ring that is ring-shaped and surrounds the second wire, the first exterior ring and the shield have a higher rigidity than the second exterior ring, the first connector housing is surrounded by the first exterior ring and the shield, and the shield is inseparably integrated with the shield shell.

The compound wire harness according to the above aspect of the present disclosure achieves an effect of enabling an improvement in transport efficiency.

DETAILED DESCRIPTION OF EMBODIMENTS

Description of Embodiments of Present Disclosure

First, embodiments of the present disclosure will be listed and described.

(1) A compound wire harness according to an aspect of the present disclosure is a compound wire harness for installation in a vehicle, the compound wire harness including: a first wire harness; and a second wire harness configured to be electrically connected to an in-vehicle device and electrically connected to the first wire harness, wherein the first wire harness includes: a first wire including a first core wire and a first insulating coating covering the first core wire; a first terminal attached to an end portion of the first core wire; a first connector housing covering the first core wire, the first insulating coating, and the first terminal; a first exterior member that is ring-shaped and surrounds the first wire, and a shielding member that is ring-shaped and electrically conductive, and is attached to a lengthwise end portion of the first exterior member, the second wire harness includes: a second wire including a second core wire and a second insulating coating covering the second core wire; a second terminal attached to an end portion of the second core wire and configured to be electrically connected to the first terminal; a second connector housing holding the second terminal; a shield shell that is ring-shaped and electrically conductive, and surrounds the second connector housing; and a second exterior member that is ring-shaped and surrounds the second wire, the first exterior member and the shielding member have a higher rigidity than the second exterior member, the first connector housing is surrounded by the first exterior member and the shielding member, and the shielding member is inseparably integrated with the shield shell.

According to this configuration, the first wire harness and the second wire harness are electrically connected to each other by connecting the first terminal of the first wire harness and the second terminal of the second wire harness to each other. For this reason, it is possible to handle the first wire harness and the second wire harness separately before electrically connecting the first wire harness and the second wire harness to each other. Accordingly, with the compound wire harness, before the shielding member and the shield shell are inseparably integrated with each other, the first wire harness and the second wire harness can be handled separately. Accordingly, before the shielding member and the shield shell are inseparably integrated with each other, the first wire harness and the second wire harness can be transported separately. As a result, the efficiency of transportation of the compound wire harness can be improved over the case where the first wire harness and the second wire harness are transported in an integrated state. Also, the shielding member and the shield shell are inseparably integrated with each other. For this reason, the connection structure for connection of the first wire harness and the second wire harness does not need to be an insertable/ removable structure. Accordingly, the connection structure for connection of the first wire harness and the second wire harness can be simplified.

Here, the term "ring-shaped" in this specification means a structure that is overall connected to form an unbroken ring, that is to say an endless structure whose start point and end point coincide with each other. Also, the term "ring-shaped" in this specification includes a circular ring whose outer edge is circular, a ring whose outer edge is elliptical or oval, a polygonal ring whose outer edge is polygonal, and a ring whose outer edge is shaped as a rounded-edge polygon, and refers to any closed shape whose outer edge is formed by connected straight lines or curved lines. The term "ring-shaped" includes a shape that has a through hole in a plan view, and the outer edge shape may be the same as the inner peripheral shape of the through hole, or the outer edge shape may be different from the inner peripheral shape of the through hole. The term "ring-shaped" includes a shape having a predetermined length along the axial direction in which the central axis of the through hole extends, and there are no limitations on the magnitude of the length. Also, the term "ring-shaped" in this specification need only be a shape that overall resembles a ring, and includes the case where a plurality of components combine to form a ring, and the case of partially including a notch or a slit as with a C-like shape.

(2) It is preferable that the compound wire harness further includes a rivet passing through the shielding member and the shield shell, and the rivet inseparably integrates the shielding member and the shield shell. According to this configuration, the shielding member and the shield shell can be inseparably integrated with each other with use of the rivet. Due to using the rivet, the shielding member and the shield shell can be joined with a high joint strength. For this reason, the reliability of electrical connection between the shielding member and the shield shell can be improved, and the electromagnetic shielding function of the shielding member and the shield shell can be suitably maintained.

(3) It is preferable that the compound wire harness further includes a caulked portion in which the shielding member and the shield shell are caulked, and the caulked portion inseparably integrates the shielding member and the shield shell According to this configuration, the shielding member and the shield shell can be inseparably integrated with each other with use of the caulked portion. Here, the caulked portion is formed by crimping the shielding member and the shield shell to plastically deform such portions. For this reason, there is no need to provide a component for integrating the shielding member and the shield shell, and the number of components can be reduced.

(4) It is preferable that the compound wire harness further includes a first sealing member that is ring-shaped and attached to an outer peripheral surface of the first connector housing, and the first sealing member is in close contact with the outer peripheral surface of the first connector housing and is in close contact with an inner peripheral surface of the first exterior member. According to this configuration, the first wire harness includes the first sealing member that is in close contact with the outer peripheral surface of the first connector housing and in close contact with the inner peripheral surface of the first exterior member. The first sealing member can achieve sealing between the first connector housing and the first exterior member, thus making it possible to suitably suppress the entrance of a liquid such as water into the first exterior member.

(5) It is preferable that the compound wire harness further includes a second sealing member that is ring-shaped and attached to an outer peripheral surface of the first connector housing, and the second sealing member is in close contact with the outer peripheral surface of the first connector housing and is in close contact with an inner peripheral surface of the shielding member. According to this configuration, the first wire harness includes the second sealing member that is in close contact with the outer peripheral surface of the first connector housing and in close contact with the inner peripheral surface of the shielding member. The second sealing member can achieve sealing between the first connector housing and the shielding member, thus making it possible to suitably suppress the entrance of a liquid such as water into the shielding member.

(6) It is preferable that the compound wire harness further includes a third sealing member covering an outer peripheral surface of the first exterior member and an outer peripheral surface of the shielding member, in a state of close contact, and the third sealing member extends across a region spanning the outer peripheral surface of the first exterior member and the outer peripheral surface of the shielding member. According to this configuration, the third sealing member extends across a region spanning the outer peripheral surface of the first exterior member and the outer peripheral surface of the shielding member, and covers the outer peripheral surface of the first exterior member and the outer peripheral surface of the shielding member, in a state of close contact with such members. The third sealing member can achieve sealing between the first exterior member and the shielding member at the connection between the first exterior member and the shielding member. Accordingly, it is possible to suitably suppress the case where a liquid such as water enters the first exterior member and the shielding member through the connection between the first exterior member and the shielding member.

(7) It is preferable that the first connector housing includes: a first end portion on a side corresponding to the first terminal; and a second end portion on a side opposite to the first end portion, and an outer peripheral surface of the second end portion includes a first guide portion inclined to approach the first wire while extending away from the first end portion. According to this configuration, the first guide portion is formed in the second end portion of the first connector housing. Accordingly, the first connector housing can be guided into the shielding member and into the first exterior member along the inclined surface of the first guide portion. For this reason, the first connector housing can be easily inserted into the shielding member and the first exterior member. As a result, it is possible to improve the ease of assembly of the first wire harness. Accordingly, it is possible to improve the ease of assembly of the compound wire hardness.

(8) It is preferable that a lengthwise end portion of the shielding member is fitted around a lengthwise end portion of the first exterior member, the first connector housing includes: a first covering portion accommodated inside the first exterior member; and a second covering portion accommodated inside the shielding member, and the second covering portion has a larger outer shape than the first covering portion, the outer shape of the second covering portion being set to a size according to which the second covering portion is not insertable into the first exterior member. According to this configuration, the size of the second covering portion of the first connector housing is set such that the second covering portion cannot be inserted into the first exterior member. Accordingly, when the first connector housing is inserted from the shielding member side toward the first exterior member, the first connector housing can be easily positioned inside the shielding member and inside the first exterior member. As a result, it is possible to improve the ease of assembly of the first wire harness. Accordingly, it is possible to improve the ease of assembly of the compound wire hardness.

(9) It is preferable that the first covering portion includes the first guide portion, and an outer peripheral surface of an end portion of the second covering portion that is connected to the first covering portion includes a second guide portion inclined to approach the first wire while extending toward the first covering portion. According to this configuration, the second guide portion is formed in the second covering portion. Accordingly, the first connector housing can be guided into the shielding member along the inclined surface of the second guide portion. For this reason, the first connector housing can be easily inserted into the shielding member. As a result, it is possible to improve the ease of assembly of the first wire harness. Accordingly, it is possible to improve the ease of assembly of the compound wire hardness.

Details of Embodiments of Present Disclosure

Specific examples of a compound wire harness according to the present disclosure will be described below with reference to the drawings. In the drawings, the configurations may be partially exaggerated or simplified for convenience in the description. Also, the dimensional ratios of various portions may differ among the drawings. Note that the present disclosure is not limited to these examples, but rather is indicated by the scope of the claims, and is intended to include all modifications within the scope and meaning equivalent to the scope of the claims.

Overall Configuration of Compound Wire Harness 10

Figure 1:
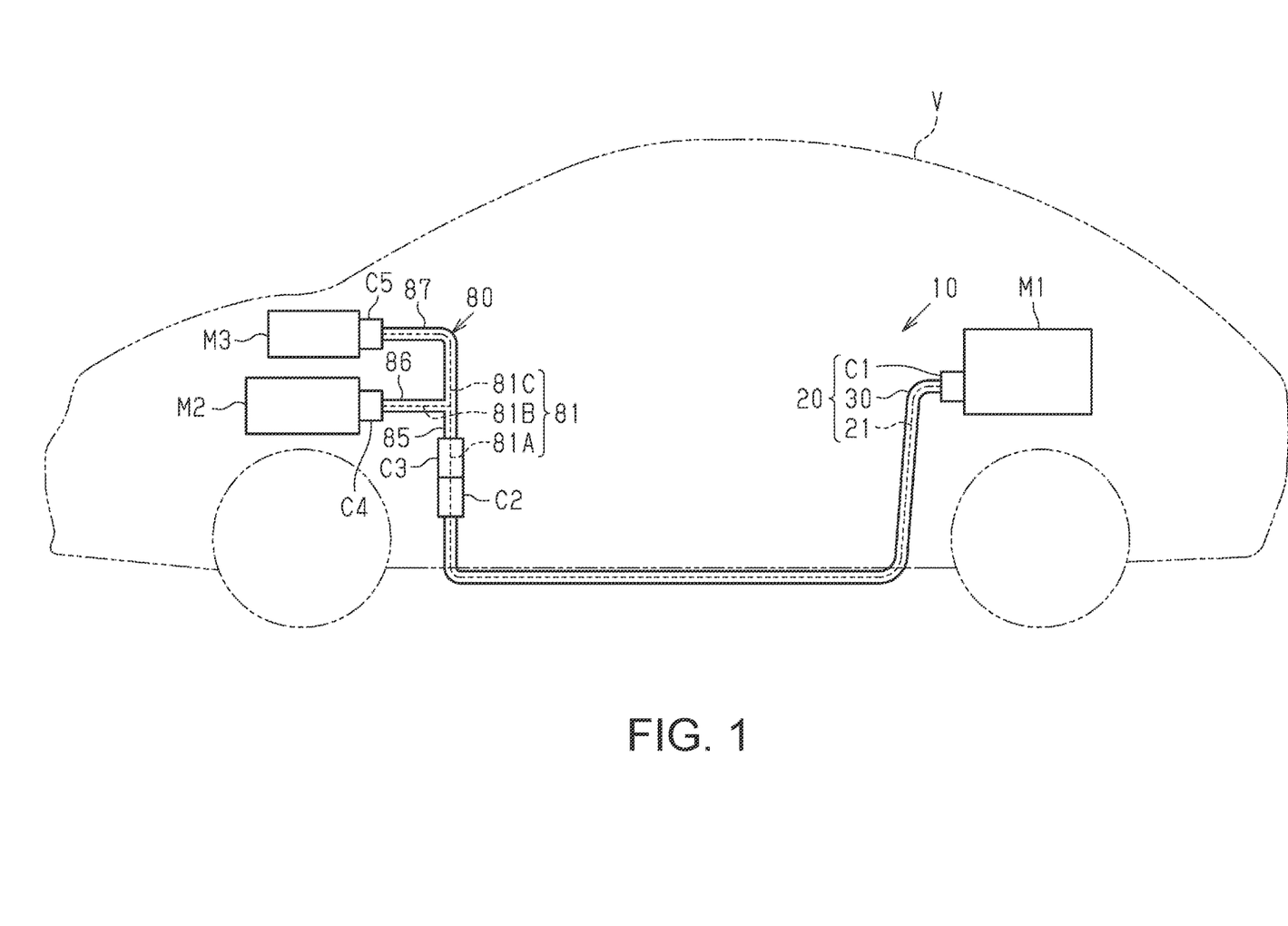
FIG. 1 is a schematic configuration diagram showing a compound wire harness according to an embodiment.

A compound wire harness 10 shown in FIG. 1 is for installation in a vehicle V such as a hybrid vehicle or an electric automobile, for example. The compound wire harness 10 electrically connects two in-vehicle devices or three or more in-vehicle devices to each other. Such in-vehicle devices are electric devices installed in the vehicle V. The compound wire harness 10 of the present embodiment electrically connects a high-voltage battery M1 to in-vehicle devices M2 and M3.

The battery M1 is provided toward the rear of vehicle V, for example. One example of the in-vehicle device M2 is an inverter installed forward of the battery M1 in the vehicle V. The battery M1 is a battery capable of supplying a voltage of 100 volts or more, for example. The in-vehicle device M2, which serves as an inverter, is connected to a wheel drive motor (not shown) that serves as a motive power source for traveling of the vehicle, for example. The inverter generates AC power from DC power received from the battery M1, and supplies the AC power to the motor. The in-vehicle device M3 is an electric device such as an air conditioner or a DC/DC converter, for example. The in-vehicle device M3 receives DC power from the battery M1. In this way, in the compound wire harness 10, DC power is distributed from the battery M1 to the in-vehicle devices M2 and M3. The in-vehicle devices M2 and M3 are provided in a vehicle compartment such as the engine room, for example.

Note that in the present embodiment, for convenience, "rear" refers to the side closer to the battery M1 in the length direction of the compound wire harness 10, and "front" refers to the side closer to the in-vehicle devices M2 and M3 in the length direction of the compound wire harness 10. Also, "rear end portion" refers to the end portion of a member located closer to the battery M1, and "front end portion" refers to the end portion of a member located closer the in-vehicle devices M2 and M3.

The compound wire harness 10 includes a wire harness 20 and a wire harness 80. The wire harness 20 is electrically connected to the battery M1, and is also electrically connected to the wire harness 80. The wire harness 20 includes a connector C1 and a connector C2. For example, the rear end portion of the wire harness 20 is connected to the battery M1 via the connector C1, and the front end portion of the wire harness 20 is connected to the wire harness 80 via the connector C2. The wire harness 80 is electrically connected to the in-vehicle devices M2 and M3, and is also electrically connected to the wire harness 20. The wire harness 80 includes a connector C3. The wire harness 20 and the wire harness 80 are electrically connected to each other by connecting the connector C2 and the connector C3 to each other. The connector C2 and the connector C3 are inseparably integrated with each other.

Configuration of Wire Harness 20

The wire harness 20 constitutes a portion of a high-voltage circuit that enables the transmission and reception of high-voltage power between the battery M1 and the wire harness 80, for example. The wire harness 20 is routed from the battery M1 to the wire harness 80, with a portion or all of the wire harness 20 in the length direction thereof passing under the floor of the vehicle V, for example.

The wire harness 20 includes one or a plurality of (two in the present embodiment) wires 21, the connector C1 attached to the rear end portions of the wires 21, the connector C2 attached to the front end portions of the wires 21, and an exterior member 30 (first exterior ring) that surrounds the wires 21. The wires 21 are elongated so as to extend in the front-rear direction of the vehicle V, for example. The wires 21 are high-voltage wires that can support high-voltage and high-current power, for example. The wires 21 may each be a shielded wire including an electromagnetic shielding structure, or may be a non-shielded wire not including an electromagnetic shielding structure, for example. The wires 21 of the present embodiment are non-shielded wires.

Configuration of Wire 21

Figure 2:
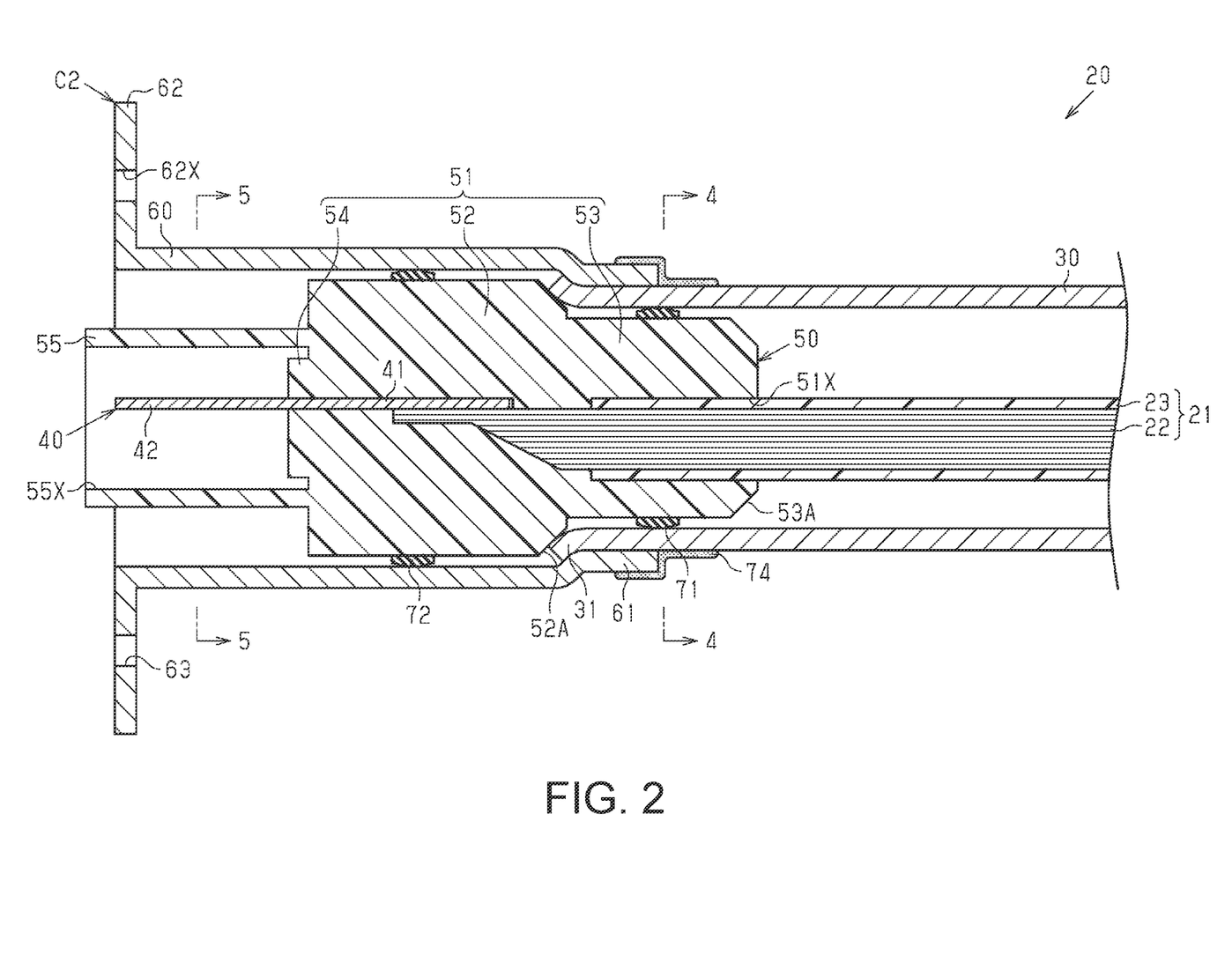
FIG. 2 is a schematic cross-sectional view of a wire harness according to an embodiment.
Figure 3:
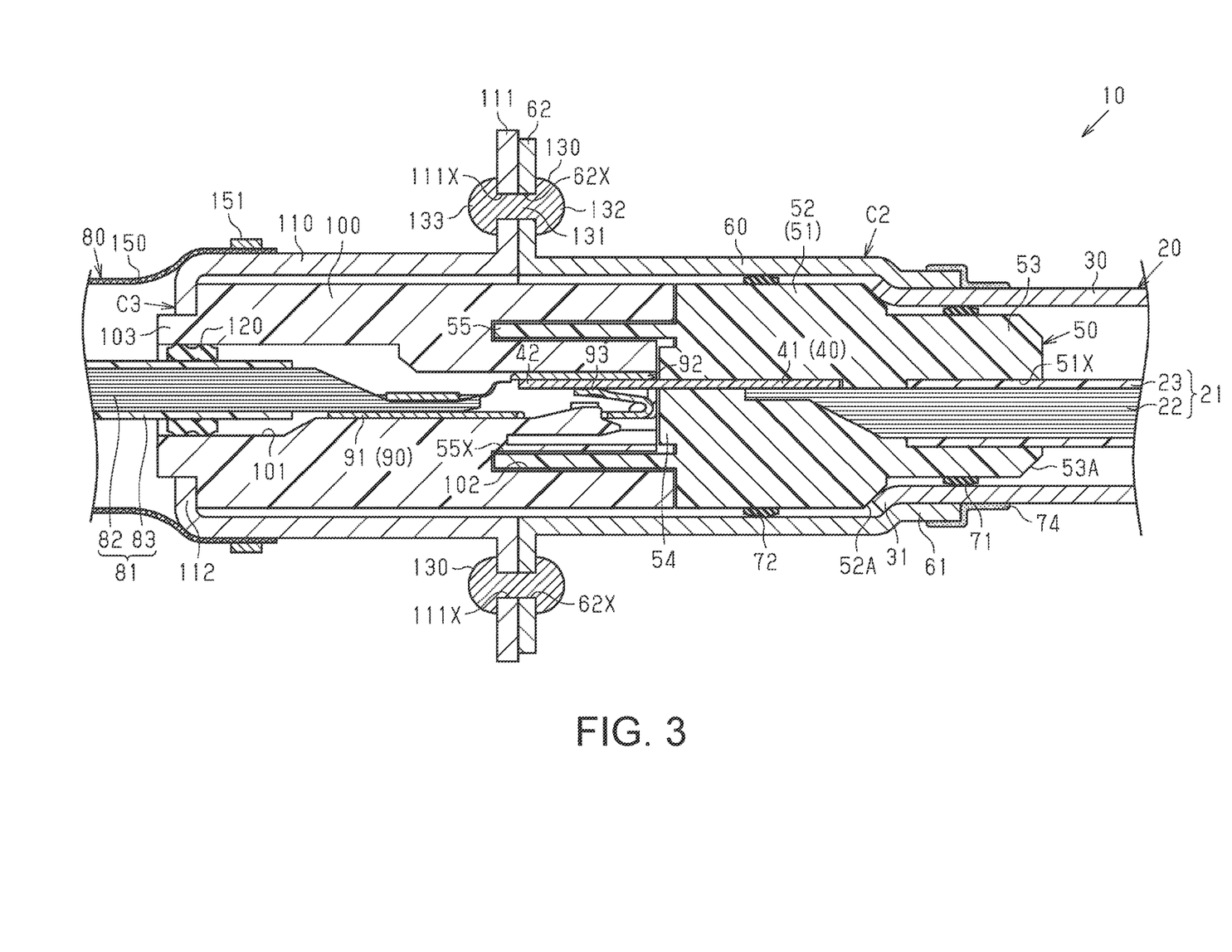
FIG. 3 is a schematic cross-sectional view of a compound wire harness according to an embodiment.

As shown in FIGS. 2 and 3, the wires 21 each include a core wire 22, which is made of a conductor, and an insulating coating 23 that surrounds the core wire 22. The core wire 22 may be a stranded wire obtained by twisting a plurality of metal wires, or a single core wire made of a single conductor, for example. The single core wire may be a columnar conductor, which is made of a single columnar metal rod having a solid internal structure, or a cylindrical conductor, which has a hollow internal structure, for example. The core wire 22 may be any combination of a stranded wire, a columnar conductor, and a cylindrical conductor. The core wire 22 of the present embodiment is a stranded wire. The material of the core wire 22 may be a metal material such as a copper-based or aluminum-based material, for example. The insulating coating 23 completely surrounds the outer peripheral surface of the core wire 22 in the circumferential direction, for example. The insulating coating 23 is made of an insulating material such as a synthetic resin, for example.

Figure 4:
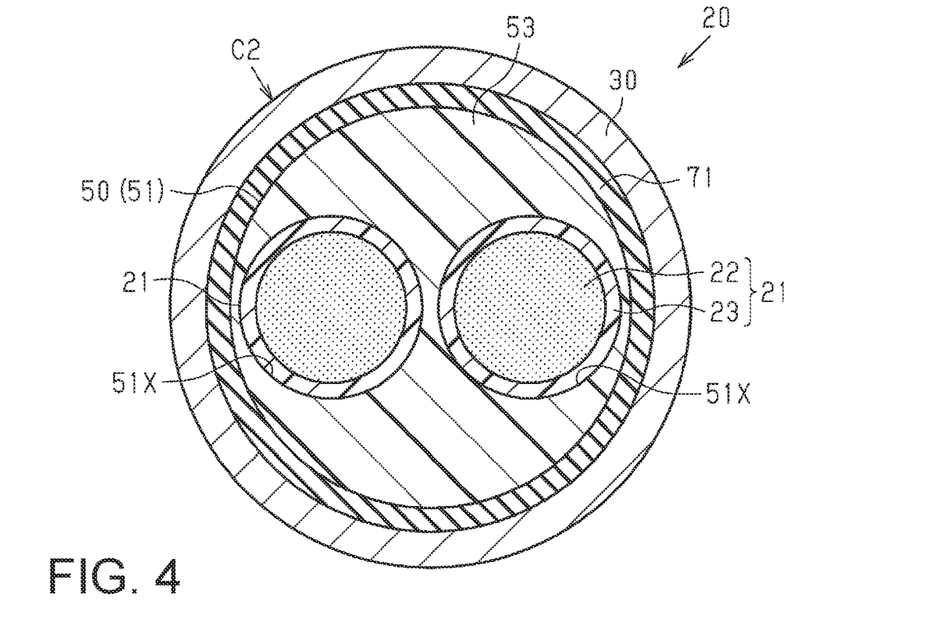
FIG. 4 is a schematic cross-sectional view (cross-sectional view taken along line 4-4 in FIG. 2) of a wire harness according to an embodiment.

As shown in FIG. 4, a cross-section of each of the wires 21 taken along a plane orthogonal to the length direction of the wires 21, that is to say the transverse section of each of the wires 21, has a circular shape. The cross-sectional shape of the wires 21 is not limited to being a circular shape, and can be any shape such as a semicircular shape, a polygonal shape, a square shape, or a flattened shape, for example.

Configuration of Exterior Member 30

The exterior member 30 is shaped as an elongated ring. The exterior member 30 accommodates the wires 21 therein. The exterior member 30 is formed so as to completely surround the plurality of wires 21 in the circumferential direction. In the wire harness 20 of the present embodiment, only the two wires 21 are accommodated in the exterior member 30. The exterior member 30 has a higher rigidity than the wires 21. For example, the exterior member 30 is a member having a higher bending rigidity than the wires 21. The exterior member 30 has a rigidity capable of maintaining the path of the wires 21, for example.

The exterior member 30 has electrical conductivity. The exterior member 30 may be a metal pipe made of a metal material, for example. The material of the exterior member 30 may be a metal material such as an aluminum-based material or a copper-based material, for example. The exterior member 30 has a function of protecting the wires 21 accommodated therein from flying objects and water droplets, and an electromagnetic shielding function of protecting the wires 21 from electromagnetic waves, for example.

The transverse sectional shape of the exterior member 30 can be any shape. For example, the transverse sectional shape of the exterior member 30 is a circular shape, a semicircular shape, a polygonal shape, a square shape, or a flattened shape. The transverse sectional shape of the exterior member 30 of the present embodiment is a circular shape. In other words, the exterior member 30 is shaped as a circular ring with a circular outer edge.

As shown in FIG. 2, one end portion (here, the front end portion) of the exterior member 30 in the length direction (axial direction) has a guiding portion 31, for example. The guiding portion 31 is shaped such that the width of the opening of the exterior member 30 increases toward the front opening end of the exterior member 30. The guiding portion 31 is shaped such that the front end portion of the exterior member 30 is inclined outward in the radial direction of the exterior member 30. The guiding portion 31 is continuous entirely around the exterior member 30 in the circumferential direction, for example. The inner peripheral surface of the guiding portion 31 is an inclined surface.

Configuration of Connector C2

The connector C2 includes terminals 40 attached to the front end portions of the wires 21, a connector housing 50 covering the wires 21 and the terminals 40, and an electrically conductive ring-shaped shielding member 60 (shield). The connector C2 includes a ring-shaped sealing member 71 (first seal), a ring-shaped sealing member 72 (second seal), and a sealing member 74 (third seal), for example.

Configuration of Terminal 40

As shown in FIG. 3, each of the terminals 40 includes a wire connection portion 41 connected to the front end portion of the wire 21, and a terminal connection portion 42 to be connected to a terminal 90 of the wire harness 80, for example. The terminals 40 are each a single-piece component in which the wire connection portion 41 and the terminal connection portion 42 are continuous and integrated with each other, for example. The terminals 40 can be formed using a metal material such as copper, a copper alloy, aluminum, an aluminum alloy, or stainless steel, for example.

Configuration of Wire Connection Portion 41

The wire connection portion 41 is electrically connected to the front end portion of the core wire 22. The wire connection portion 41 is connected to the front end portion of the core wire 22 exposed from the insulating coating 23, for example. The wire connection portion 41 is connected to the core wire 22 by crimping or ultrasonic welding, for example. The wire connection portion 41 and the core wire 22 are thus electrically and mechanically connected to each other.

Configuration of Terminal Connection Portion 42

The terminal connection portion 42 is a male terminal, for example. The terminal connection portion 42 is shaped as flat plate, for example. For example, when the connector C2 and the connector C3 are connected to each other, the terminal connection portion 42 is inserted into the terminal 90, which is a female terminal.

Configuration of Connector Housing 50

As shown in FIG. 2, the connector housing 50 holds the wires 21 and the terminals 40. The connector housing 50 covers the core wires 22, the insulating coatings 23, and the terminals 40.

The connector housing 50 includes a body portion 51 and a tubular portion 55, for example. The body portion 51 and the tubular portion 55 of the connector housing 50 are continuous and integrated with each other, for example. The connector housing 50 is formed by insert molding performed using portions of the wires 21 and portions of the terminals 40 as insert portions, for example. The connector housing 50 is integrated with the wires 21 and the terminals 40, for example. The connector housing 50 can be formed using mold resin, for example. The connector housing 50 can be formed using a synthetic resin containing aromatic nylon resin or polybutylene terephthalate resin as a main component, for example. The connector housing 50 can be formed using a single type of material or using an appropriate combination of two or more types of materials.

Configuration of Body Portion 51

The body portion 51 is elongated and extends along the length direction of the wires 21, for example. The body portion 51 has through holes 51X through which the wires 21 and the terminals 40 pass. As shown in FIG. 4, the body portion 51 has a plurality of through holes 51X through which the wires 21 respectively pass. The through holes 51X are spaced apart from each other. For this reason, the wires 21 are separated from each other while being held by the body portion 51. Note that the sealing member 74 is not shown in FIG. 4.

As shown in FIG. 2, the body portion 51 covers a region extending from the front end portion of the insulating coating 23 to a lengthwise intermediate portion of the terminal 40, for example. The body portion 51 covers the front end portions of the insulating coatings 23, the portions of the core wires 22 exposed from the insulating coatings 23, and the wire connection portions 41 of the terminals 40, in a state of close contact with such members, for example. The inner peripheral surface of each of the through holes 51X is in close contact with the outer peripheral surface of the corresponding insulating coatings 23, the outer peripheral surface of the corresponding core wire 22, and the outer peripheral surface of the corresponding wire connection portion 41, for example. The inner peripheral surface of each of the through holes 51X completely surrounds, in the circumferential direction, the outer peripheral surface of the corresponding insulating coating 23, the outer peripheral surface of the corresponding core wire 22, and the outer peripheral surface of the corresponding wire connection portion 41. The inner peripheral surface of each of the through holes 51X has a step conforming to the outer peripheral surface of the corresponding insulating coating 23, the outer peripheral surface of the corresponding core wire 22, and the outer peripheral surface of the corresponding wire connection portion 41, for example. In other words, the front end portion of the insulating coating 23, the portion of the core wire 22 exposed from the insulating coating 23, and the wire connection portion 41 are embedded in the body portion 51.

The body portion 51 includes a first end portion and a second end portion in the length direction (axial direction) of the body portion 51. The first end portion of the body portion 51 is the end portion closer to the terminal 40, out of the two end portions of the body portion 51 in the length direction. The second end portion of the body portion 51 is the end portion provided on the side opposite to the first end portion in the length direction of the body portion 51.

The body portion 51 includes a covering portion 52 (second cover) provided in the first end portion of the body portion 51, a covering portion 53 provided in the second end portion of the body portion 51, and one or a plurality of (here, two) protrusions 54 provided in the first end portion of the body portion 51, for example. The covering portion 52 and the protrusions 54 are housed inside the shielding member 60. The covering portion 53 is housed inside the exterior member 30.

Figure 5:
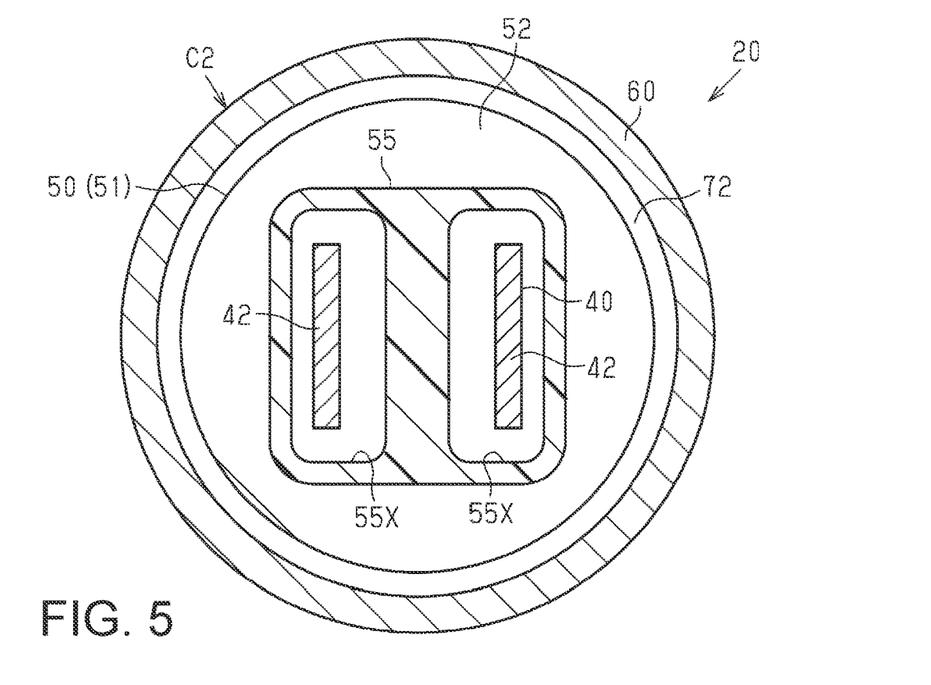
FIG. 5 is a schematic cross-sectional view (cross-sectional view taken along line 5-5 in FIG. 2) of a wire harness according to an embodiment.

As shown in FIG. 5, the covering portion 52 has an outer peripheral surface whose shape corresponds to the inner peripheral surface of the shielding member 60, for example. The outer peripheral surface of the covering portion 52 has a circular transverse sectional shape, for example. In other words, the covering portion 52 is shaped as a circular ring.

As shown in FIG. 4, the covering portion 53 has an outer peripheral surface whose shape corresponds to the inner peripheral surface of the exterior member 30, for example. The outer peripheral surface of the covering portion 53 has a circular transverse sectional shape, for example. In other words, the covering portion 53 is shaped as a circular ring.

As shown in FIG. 2, the outer shape of the covering portion 52 is larger than the outer shape of the covering portion 53. For example, the outer circumference of the covering portion 52 is larger than the outer circumference of the covering portion 53. The outer circumference of the covering portion 52 is larger than the inner circumference of the exterior member 30, for example. The outer circumference of the covering portion 52 is larger than the inner circumference of the guiding portion 31, for example. For example, the outer circumference of the covering portion 52 is set such that the covering portion 52 cannot be inserted into the exterior member 30. The outer circumference of the covering portion 53 is set such that the covering portion 53 can be inserted into the exterior member 30. Here, the phrase "the outer circumference of the member A" in this specification refers to the length of one trip around the outer peripheral surface of the member A along the circumferential direction of the member A. Also, the phrase "the inner circumference of the member A" in this specification refers to the length of one trip around the inner peripheral surface of the member A along the circumferential direction of the member A.

The body portion 51 has a step formed by the outer peripheral surface of the covering portion 52 and the outer peripheral surface of the covering portion 53, for example. The outer peripheral surface of the covering portion 52 is concentric with the outer peripheral surface of the covering portion 53 in a plan view of the body portion 51 in the length direction, for example.

The covering portion 52 includes a guide portion 52A provided on the outer peripheral surface in the end portion (i.e., the rear end portion) connected to the covering portion 53, out of the two end portions of the covering portion 52 in the length direction, for example. The guide portion 52A is inclined so as to approach the wire 21 while extending toward the covering portion 53 in the length direction of the covering portion 52. The guide portion 52A is tapered so as to become narrower toward the rear end surface of the covering portion 52, for example. The guide portion 52A extends from a lengthwise intermediate portion of the covering portion 52 to the rear end surface of the covering portion 52. The guide portion 52A is continuous entirely around the covering portion 52 in the circumferential direction, for example. The outer circumference of the guide portion 52A is smaller than the outer circumference of the portion of the covering portion 52 excluding the guide portion 52A. The outer circumference of the guide portion 52A is larger than the inner circumference of the portion of the exterior member 30 excluding the guiding portion 31, for example. The guide portion 52A faces the inner peripheral surface of the guiding portion 31 in the length direction of the body portion 51, for example. The guide portion 52A has a function of guiding the portion of the covering portion 52 excluding the guide portion 52A into the shielding member 60 when the connector housing 50 is inserted into the shielding member 60. For example, since the connector housing 50 can be guided into the shielding member 60 along the inclined surface of the guide portion 52A, the connector housing 50 can be easily inserted into the shielding member 60.

Here, the term "facing" in this specification means that surfaces or members are at positions in front of each other, and includes not only the case where they completely face each other, but also the case where they partially face each other. Also, the term "facing" in this specification includes both the case where a different member is interposed between two facing members and the case where nothing is interposed between two facing members.

The covering portion 53 (first cover) includes a guide portion 53A (first guide) provided on the outer peripheral surface of the end portion (i.e., the rear end portion) of the covering portion 53 on the side opposite to the end portion connected to the covering portion 52, out of the two end portions of the covering portion 53 in the length direction. The guide portion 53A is provided in the second end portion of the body portion 51. The guide portion 53A is inclined so as to approach the wires 21 while extending away from the first end portion of body portion 51. The guide portion 53A is formed in a tapered shape that tapers toward the rear end surface of the covering portion 53, for example. The guide portion 53A extends from a lengthwise intermediate portion of the covering portion 53 to the rear end surface of the covering portion 53. The guide portion 53A is continuous entirely around the covering portion 53 in the circumferential direction, for example. The outer circumference of the guide portion 53A is smaller than the outer circumference of the portion of the covering portion 53 excluding the guide portion 53A. The guide portion 53A has a function of guiding the portion of the covering portion 53 excluding the guide portion 53A into the exterior member 30 when the connector housing 50 is inserted into the exterior member 30. For example, since the connector housing 50 can be guided into the interior of the exterior member 30 along the inclined surface of the guide portion 53A, the connector housing 50 can be easily inserted into the interior of the exterior member 30.

The protrusions 54 protrude forward from the front end surface of the body portion 51 (covering portion 52). One protrusion 54 is provided for each of the terminals 40. The protrusions 54 each cover a lengthwise intermediate portion of the corresponding terminal 40, in a state of close contact therewith. The outer circumference of each of the protrusions 54 is smaller than the outer circumference of the covering portion 52.

Configuration of Tubular Portion 55

The tubular portion 55 protrudes forward from the front end surface of the body portion 51. The tubular portion 55 surrounds the terminals 40 exposed from the body portion 51 (i.e., the terminal connection portions 42). The tubular portion 55 surrounds the terminal connection portions 42 without coming into contact with the outer peripheral surfaces of the terminal connection portions 42. The front end portion of the tubular portion 55 projects forward beyond the front end surfaces of the terminal connection portions 42, for example. The front end portion of the tubular portion 55 projects forward beyond the front end surface of the shielding member 60, for example.

FIG. 5 shows an example of the arrangement of the terminals 40 in the connector housing 50. As shown in FIG. 5, the tubular portion 55 of the connector housing 50 can have one or a plurality of (two in the example in FIG. 5) through holes 55X. One terminal connection portion 42 is accommodated inside each of the through holes 55X. The inner peripheral surface of each of the through holes 55X is spaced apart from the outer peripheral surface of the corresponding terminal connection portion 42. The transverse sectional shape of the tubular portion 55 and the through holes 55X can be any shape. For example, the transverse sectional shape of the tubular portion 55 and the through holes 55X is a rectangular shape.

Configuration of Shielding Member 60

As shown in FIG. 2, the shielding member 60 is shaped as an elongated ring. The connector housing 50 is accommodated in the shielding member 60. The shielding member 60 surrounds the wires 21, the terminals 40, and the connector housing 50. For example, the shielding member 60 completely surrounds the wires 21, the terminals 40, and the connector housing 50 in the circumferential direction. The outer circumference of the shielding member 60 is larger than the outer circumference of the exterior member 30, for example. The inner circumference of the shielding member 60 is larger than the outer circumference of the exterior member 30, for example. The shielding member 60 has a higher rigidity than the wires 21. The shielding member 60 is a member having a higher bending rigidity than the wires 21, for example. The shielding member 60 can be formed using a metal material such as an aluminum-based or copper-based material, for example. The shielding member 60 may be made of the same material as the exterior member 30 or a different material from the exterior member 30. The shielding member 60 has an electromagnetic shielding function of protecting the wires 21 from electromagnetic waves.

The shielding member 60 is attached to one lengthwise end portion (here, the front end portion) of the exterior member 30. The rear end portion of the shielding member 60 includes a connection portion 61 that is electrically and mechanically connected to the front end portion of the exterior member 30. The connection portion 61 is fitted around the front end portion of the exterior member 30. The outer circumference of the connection portion 61 is smaller than the outer circumference of the portion of the shielding member 60 excluding the connection portion 61, for example. The connection portion 61 shaped so as to extend along the outer peripheral surface of the front end portion of the exterior member 30 including the guiding portion 31, for example. The inner peripheral surface of the connection portion 61 is in close contact with the outer peripheral surface of the front end portion of the exterior member 30.

The inner peripheral surface of the connection portion 61 is in close contact with the outer peripheral surface of the front end portion of the exterior member 30 over the entire circumference, for example. The connection portion 61 is attached to the outer peripheral surface of the front end portion of the exterior member 30 by being crimped around the front end portion of the exterior member 30, for example. The shielding member 60 is attached to the outer peripheral surface of the exterior member 30 by crimping the connection portion 61 provided at the rear end portion of the shielding member 60, for example. Accordingly, the shielding member 60 is in contact with the outer peripheral surface of the exterior member 30 and electrically connected to the exterior member 30.

As shown in FIG. 3, the front end portion of the shielding member 60 includes a fixing portion 62 to be fixed to the connector C3. The fixing portion 62 protrudes outward in the radial direction of the shielding member 60 from the outer peripheral surface of the front end portion of the shielding member 60, for example. The fixing portion 62 is ring-shaped and is continuous entirely around the shielding member 60 in the circumferential direction, for example. The fixing portion 62 is plate-shaped, for example. The fixing portion 62 includes one or a plurality of (here, two) through holes 62X that pass through the fixing portion 62 in the plate thickness direction. Rivets 130 are inserted into the through holes 62X.

As described above, the shielding member 60 and the exterior member 30 surround the connector housing 50. In other words, the connector housing 50 is surrounded by the shielding member 60 and the exterior member 30 that have a higher rigidity than the wires 21.

Configuration of Sealing Members 71, 72

The sealing member 71 is attached to the outer peripheral surface of the covering portion 53. The sealing member 71 is provided inside the exterior member 30. The sealing member 71 is ring-shaped and is continuous entirely around the covering portion 53 in the circumferential direction. The sealing member 71 of the present embodiment is shaped as a circular ring. The sealing member 71 is configured to be elastically deformable. The sealing member 71 is in close contact with the outer peripheral surface of the covering portion 53, and is in close contact with the inner peripheral surface of the exterior member 30, for example. The sealing member 71 achieves sealing between the outer peripheral surface of the covering portion 53 and the inner peripheral surface of the exterior member 30.

The sealing member 72 is attached to the outer peripheral surface of the covering portion 52. The sealing member 72 is provided inside the shielding member 60. The sealing member 72 is ring-shaped and is continuous entirely around the covering portion 52 in the circumferential direction. The sealing member 72 of the present embodiment is shaped as a circular ring. The sealing member 72 is configured to be elastically deformable. The sealing member 72 is in close contact with the outer peripheral surface of the covering portion 52, and is in close contact with the inner peripheral surface of the shielding member 60, for example. The sealing member 72 achieves sealing between the outer peripheral surface of the covering portion 52 and the inner peripheral surface of the shielding member 60.

The sealing members 71 and 72 are made of a rubber material, for example. Examples of materials that can be used for the sealing members 71 and 72 include nitrile rubber, silicone rubber, urethane rubber, acrylic rubber, butyl rubber, and ethylene propylene rubber, for example.

Configuration of Sealing Member 74

The sealing member 74 achieves sealing between the shielding member 60 and the exterior member 30. The sealing member 74 covers the outer peripheral surface of the shielding member 60 and the outer peripheral surface of the exterior member 30. The sealing member 74 continuously covers a region extending from the outer peripheral surface of the connection portion 61 to the outer peripheral surface of a portion of the exterior member 30 exposed from the connection portion 61. For example, the sealing member 74 continuously covers the outer peripheral surface of the rear end portion of the connection portion 61, the rear end surface of the connection portion 61, and the outer peripheral surface of a portion of the exterior member 30 exposed from the connection portion 61. In other words, the sealing member 74 extends across a region spanning the outer peripheral surface of the shielding member 60 and the outer peripheral surface of the exterior member 30. The sealing member 74 is in close contact with the outer peripheral surface of the connection portion 61, the rear end surface of the connection portion 61, and the outer peripheral surface of the exterior member 30, for example. The sealing member 74 is continuous entirely around the shielding member 60 and the exterior member 30 in the circumferential direction. For example, a liquid gasket can be used as the sealing member 74. A silicone-based liquid gasket can be used as the liquid gasket, for example. After the rear end portion of the shielding member 60 is attached to the front end portion of the exterior member 30, the sealing member 74 is formed by applying a sealing agent such as a liquid gasket, for example. Note that the sealing member 74 can be formed using a conductive bonding material such as a brazing material, for example.

As shown in FIG. 1, the wire harness 20 is routed in a portion of the route of the compound wire harness 10 where routing is easy and the shape needs to be maintained (e.g., under the floor), for example. For this reason, in the wire harness 20, it is preferable that either the wires 21 or the exterior member 30 have a route regulating function. In the wire harness 20 of the present embodiment, the exterior member 30 has a route regulating function.

Configuration of Wire Harness 80

The wire harness 80 electrically connects the wire harness 20 to the in-vehicle devices M2 and M3. The wire harness 80 constitutes a high-voltage circuit that enables the transmission and reception of high-voltage power between the wire harness 20 and the in-vehicle devices M2 and M3, for example. The entirety of the wire harness 80 in the length direction is routed in a vehicle compartment such as the engine room, for example. The wire harness 80 is provided in an area that does not require waterproofing, for example.

The wire harness 80 includes one or a plurality of (two in the present embodiment) wires 81 and the connector C3 attached to rear end portions of the wires 81, for example. The wires 81 include a wire 81A whose rear end portion is connected to the connector C3, and a wire 81B and a wire 81C that are connected to the front end portion of the wire 81A, for example. The wire harness 80 includes a connector C4 attached to the front end portion of the wire 81B, a connector C5 attached to the front end portion of the wire 81C, and an exterior member 85 (second exterior ring) that surrounds the wires 81A, 81B, and 81C, for example. The rear end portion of the wire 81B is electrically connected to the wire 81A, and the front end portion of the wire 81B is connected to the connector C4. The rear end portion of the wire 81A is connected to the wire harness 20 via the connector C3, and the front end portion of the wire 81B is connected to the in-vehicle device M2 via the connector C4, for example. The rear end portion of the wire 81C is electrically connected to the wire 81A, and the front end portion of the wire 81C is connected to the connector C5. The rear end portion of the wire 81A is connected to the wire harness 20 via the connector C3, and the front end portion of the wire 81C is connected to the in-vehicle device M3 via the connector C5, for example. The wires 81 branch from the one wire 81A into the two wires 81B and 81C at a lengthwise intermediate portion of the wires 81, for example. The connections between the wire 81A and the wires 81B and 81C are provided inside the exterior member 85, for example. In the compound wire harness 10, DC power supplied from the battery M1 is distributed to the wires 81B and 81C, and is supplied through the wires 81B and 81C to the in-vehicle devices M2 and M3.

Configuration of Wire 81

As shown in FIG. 3, each of the wires 81 includes a core wire 82 made of a conductor, and an insulating coating 83 that covers the core wire 82. The wires 81 having a higher flexibility than the exterior member 30. The wires 81 have a higher bendability than the exterior member 30. The wires 81 have an elongated shape. The wires 81 are high-voltage wires that can support high-voltage and high-current power, for example. The wires 81 may each be a shielded wire or a non-shielded wire. The wires 81 of the present embodiment are each a non-shielded wire.

The core wire 82 can be a stranded wire, a columnar conductor, a cylindrical conductor, or any combination thereof, for example. The core wire 82 of the present embodiment is a stranded wire. The core wire 82 can be formed using a metal material such as a copper-based or aluminum-based material, for example. The insulating coating 83 completely covers the outer peripheral surface of the core wire 82 in the circumferential direction, for example. The insulating coating 83 is made of an insulating material such as a synthetic resin, for example.

The transverse sectional shape of the wires 81 can be any shape. For example, the transverse sectional shape of the wires 81 is circular, semicircular, polygonal, square, or flattened. The wires 81 of the present embodiment have a circular transverse sectional shape.

Configuration of Connector C3

The connector C3 includes terminals 90 attached to the rear end portions of the wires 81, a connector housing 100 that holds the terminals 90, a shield shell 110, and a sealing member 120.

Configuration of Terminal 90

The terminals 90 each include a wire connection portion 91 connected to the rear end portion of the corresponding wire 81, and a terminal connection portion 92 to be connected to the corresponding terminal 40 of the wire harness 20, for example. The terminals 90 are each a single component in which the wire connection portion 91 and the terminal connection portion 92 are continuous and integrated with each other, for example. The terminals 90 can be made of a metal material such as copper, a copper alloy, aluminum, an aluminum alloy, or stainless steel, for example.

Configuration of Wire Connection Portion 91

The wire connection portion 91 is electrically connected to the rear end portion of the corresponding core wire 82. The wire connection portion 91 is connected to the rear end portion of the portion of the core wire 82 exposed from the insulating coating 83, for example. The wire connection portion 91 is connected to the core wire 82 by crimping or ultrasonic welding, for example. The wire connection portion 91 and the core wire 82 are thus electrically and mechanically connected to each other.

Configuration of Terminal Connection Portion 92

The terminal connection portions 92 are each a female terminal, for example. The terminal connection portion 92 is ring-shaped, for example. The terminal connection portion 92 is shaped as a quadrangular ring with a quadrangular outer edge shape, for example. For example, a connection piece 93 is provided inside the terminal connection portion 92. The connection piece 93 is elastically deformable due to being supported in a cantilever manner on the bottom wall of the terminal connection portion 92, for example.

The terminal connection portion 42, which is a male terminal, is inserted into the terminal connection portion 92, for example. At this time, the terminal connection portion 42 is sandwiched between the connection piece 93 and the inner surface of the terminal connection portion 42 inside the terminal connection portion 92. The terminal connection portion 42 and the terminal connection portion 92 are thus electrically connected to each other.

Configuration of Connector Housing 100

The connector housing 100 holds the wires 81 and the terminals 90. The connector housing 100 surrounds the core wires 82, the insulating coatings 83, and the terminals 90. The connector housing 100 surrounds the rear end portions of the insulating coatings 83, the portions of the core wires 82 exposed from the insulating coatings 83, and the terminals 90, for example. The connector housing 100 can be made of an insulating material such as a synthetic resin, for example. The connector housing 100 can be made of a synthetic resin such as polyolefin, polyamide, polyester, or ABS resin, for example.

The connector housing 100 is elongated and extends along the length direction of the wires 81. The connector housing 100 is ring-shaped with an outer peripheral surface whose shape corresponds to the inner peripheral surface of the shielding member 60, for example. The outer peripheral surface of the connector housing 100 shape corresponds to the inner peripheral surface of the shield shell 110, for example. The connector housing 100 of the present embodiment is shaped as a circular ring with a circular outer edge shape.

The connector housing 100 has one or a plurality of (here, two) holding holes 101, for example. The holding holes 101 pass through the connector housing 100 in the length direction. One terminal 90 is held inside each of the holding holes 101. The terminals 90 are inserted into the holding holes 101 from the front side, for example. Also, a sealing member 120 attached to the outer peripheral surface of the insulating coating 83 is accommodated inside each of the holding holes 101, for example. A rubber ring can be used as the sealing member 120, for example. The sealing member 120 achieves sealing between the outer peripheral surface of the wire 81 and the inner peripheral surface of the holding hole 101.

The connector housing 100 has a groove 102 provided in the rear end portion of the connector housing 100, for example. The groove 102 extends from the rear end surface of connector housing 100 in a direction along the length direction of the connector housing 100. The size of the groove 102 is set so as to be capable of accommodating the tubular portion 55 of the connector C2, for example. For example, when the connector C2 and the connector C3 are connected, the rear end portion of the connector housing 100 is fitted inside the shielding member 60, and the tubular portion 55 is fitted in the groove 102.

The connector housing 100 includes a protrusion 103 that protrudes forward from the front end surface of the connector housing 100, for example. The outer circumference of the protrusion 103 is smaller than the outer circumference of the portion of the connector housing 100 excluding the protrusion 103. For this reason, the outer peripheral surface of the front end portion of the connector housing 100 has a step formed by the outer peripheral surface of the protrusion 103 and the front end surface of the connector housing 100.

Configuration of Shield Shell 110

The shield shell 110 is elongated and extends along the length direction of the wires 81. The shield shell 110 is shaped as a ring extending along the outer peripheral surface of the connector housing 100, for example. The shield shell 110 of the present embodiment is shaped as a circular ring. The shield shell 110 surrounds the connector housing 100. The shield shell 110 also surrounds the wires 81 and the terminals 90. For example, the shield shell 110 completely surrounds the wires 81, the terminals 90, and the connector housing 100 in the circumferential direction. The shield shell 110 holds the connector housing 100, for example. The shield shell 110 can be made of a metal material such as a copper-based, aluminum-based, or iron-based material, for example. The shield shell 110 has an electromagnetic shielding function of protecting the wires 81 from electromagnetic waves.

The shield shell 110 includes a fixing portion 111 provided in the rear end portion of the shield shell 110, and an engaging portion 112 provided in the front end portion of the shield shell 110.

The fixing portion 111 protrudes outward in the radial direction of the shield shell 110 from the outer peripheral surface of the rear end portion of the shield shell 110, for example. The fixing portion 111 is ring-shaped and is continuous entirely around the shield shell 110 in the circumferential direction, for example. The fixing portion 111 is plate-shaped, for example. The fixing portion 111 includes through holes 111X passing through the fixing portion 111 in the thickness direction, for example. The two through holes 111X are provided at positions corresponding to two through holes 62X. Rivets 130 are passed through the through holes 111X and the through holes 62X. The shield shell 110 is inseparably integrated with the shielding member 60 with use of the rivets 130. Accordingly, the connector C3 is inseparably fixed to the connector C2. Also, the shield shell 110 and the shielding member 60 are electrically connected to each other.

Here, each of the rivets 130 has a shaft portion 131, a head portion 132 provided at the rear end portion of the shaft portion 131, and a head portion 133 provided at the front end portion of the shaft portion 131. The shaft portion 131 passes through the through holes 62X and 111X. The head portions 132 and 133 have a larger outer shape than the shaft portion 131. The outer circumference of the head portions 132 and 133 is larger than the outer circumference of the shaft portion 131. The outer circumference of the head portions 132 and 133 is set such that the head portions 132 and 133 cannot be inserted into the through holes 62X and 111X. The front end surface of the head portion 132 engages with the rear end surface of the fixing portion 62, for example. The rear end surface of the head portion 133 engages with the front end surface of the fixing portion 111, for example. For example, one rivet 130 having the shaft portion 131 and the head portion 132 is inserted into the through holes 62X and 111X, and then the front end portion of the shaft portion 131 is crimped with a dedicated tool such as a rivet punch in order to form the head portion 133 at the front end portion of the shaft portion 131.

The engaging portion 112 protrudes inward in the radial direction of the shield shell 110 from the inner peripheral surface of the front end portion of the shield shell 110, for example. The engaging portion 112 engages with a step provided in the front end portion of the connector housing 100.

Configuration of Wire Harness 80

The wire harness 80 includes a shielding member 150 and a fixing member 151 that fixes the shielding member 150 to the connector C3, for example.

The shielding member 150 is shaped as an elongated ring extending along the length direction of the wires 81. The shielding member 150 surrounds the portions of the wires 81 that are exposed from the shield shell 110, for example. The shielding member 150 surrounds the wires 81 all together, for example. The shielding member 150 has a higher flexibility than the exterior member 30. The shielding member 150 has a higher bendability than the exterior member 30, for example. The shielding member 150 can be made of a flexible braided wire or metal foil, for example. The shielding member 150 can be made of a metal material such as a copper-based or aluminum-based material, for example. The shielding member 150 has an electromagnetic shielding function of protecting the wires 81 from electromagnetic waves.

The fixing member 151 fixes the shielding member 150 to the outer peripheral surface of the shield shell 110 while the shielding member 150 is in contact with the shield shell 110, for example. The fixing member 151 is attached to the outer peripheral surface of the shield shell 110. The fixing member 151 is ring-shaped and extends along the outer peripheral surface of shield shell 110. The fixing member 151 of the present embodiment is shaped as a circular ring. The fixing member 151 is fitted around the shield shell 110 in such a manner that the rear end portion of the shielding member 150 is sandwiched between the fixing member 151 and the outer peripheral surface of the shield shell 110. The fixing member 151 is tightened inward in the radial direction of the shield shell 110, such that the rear end portion of shielding member 150 is fixed in direct contact with the outer peripheral surface of shield shell 110. The shielding member 150 is thus electrically and mechanically connected to the shield shell 110. When the connector C2 and the connector C3 are connected, the shielding member 150, the shield shell 110, the shielding member 60, and the exterior member 30 are electrically connected to each other. A crimping ring, a binding band, or a tape member can be used as the fixing member 151, for example. The crimping ring can be made of a metal material such as an iron-based, aluminum-based, or copper-based material, for example.

Configuration of Exterior Member 85

The exterior member 85 shown in FIG. 1 is overall shaped as an elongated ring. The wires 81 and the shielding member 150 (see FIG. 3) are accommodated in the exterior member 85, for example. The exterior member 85 completely surrounds the shielding member 150 in the circumferential direction. The exterior member 85 includes branch portions 86 and 87 that extend along different routes, for example. The branch portion 86 surrounds the wire 81B, for example. The branch portion 87 surrounds the wire 81C, for example. The exterior member 85 protects the wires 81 housed therein from flying objects and the like. The exterior member 85 has a higher flexibility than the exterior member 30, for example. The exterior member 85 has a higher bendability than the exterior member 30, for example. The exterior member 85 can be a flexible corrugated tube made of resin or the like, a rubber waterproof cover, or a combination of such members, for example. The exterior member 85 may be constituted by a single component, or may be constituted by a combination of components.

The wire harness 80 has a higher flexibility than the wire harness 20. The wire harness 80 is routed in a section corresponding to the region including the in-vehicle devices M2 and M3, which is a section where there is little space for the wiring route of the compound wire harness 10 and routing is difficult, for example. The wire harness 80 is susceptible to vibration caused by the engine or the like, and is routed in a swing section where the compound wire harness 10 swings, for example. Since the wire harness 80 has excellent flexibility, the wire harness 80 absorbs the swing motion, and damage such as wire breakage of the wire harness 80 can be suppressed.

Next, actions and effects of the present embodiment will be described.

(1) In the compound wire harness 10, the wire harness 20 and the wire harness 80 are electrically connected to each other by connecting the terminal 40 of the wire harness 20 and the terminal 90 of the wire harness 80 to each other. For this reason, it is possible to handle the wire harness 20 and the wire harness 80 separately before electrically connecting the wire harness 20 and the wire harness 80 to each other. Accordingly, with the compound wire harness 10, before the shielding member 60 and the shield shell 110 are inseparably integrated with each other, the wire harness 20 and the wire harness 80 can be handled separately. As a result, the wire harness 20 and the wire harness 80 can be transported separately before the shielding member 60 and shield shell 110 are inseparably integrated with each other. As a result, the efficiency of transportation of the compound wire harness 10 can be improved.

(2) The shielding member 60 and the shield shell 110 are inseparably integrated with each other. For this reason, the connection structures for connection of the wire harness 20 and the wire harness 80, that is to say the structures of the connectors C2 and C3, do not need to be insertable/removable structures. Accordingly, the structures of the connectors C2 and C3 can be simplified.

(3) The shielding member 60 and the shield shell 110 are inseparably integrated with each other with use of the rivets 130. Due to using the rivets 130, the shielding member 60 and the shield shell 110 can be joined with a high joint strength. For this reason, the reliability of electrical connection between the shielding member 60 and the shield shell 110 can be improved, and the electromagnetic shielding function of the shielding member 60 and the shield shell 110 can be suitably maintained.

(4) The wire harness 20 and the wire harness 80 are formed individually, thus making it possible for the electromagnetic shield structure for the wire harness 20 and the electromagnetic shield structure for the wire harness 80 to be set individually. Also, the structure of the wire 21 and the structure of the wire 81 can be set individually.

(5) The sealing member 71 is provided to achieve sealing between the outer peripheral surface of the connector housing 50 and the inner peripheral surface of the exterior member 30, and the sealing member 72 is provided to achieving sealing between the outer peripheral surface of the connector housing 50 and the inner peripheral surface of the shielding member 60. These sealing members 71 and 72 can suitably suppress the entrance of a liquid such as water into the shielding member 60 and into the exterior member 30.

(6) The sealing member 74 for achieving sealing between the exterior member 30 and the shielding member 60 is provided at the connection between the exterior member 30 and the shielding member 60. Accordingly, it is possible to suitably suppress the case where a liquid such as water enters the exterior member 30 and the shielding member 60 through the connection between the exterior member 30 and the shielding member 60.

(7) The sealing member 74 is formed by applying a sealing agent after the rear end portion of the shielding member 60 and the front end portion of the exterior member 30 are connected. Accordingly, it is possible to suppress the case where the electrical connection between the shielding member 60 and the exterior member 30 is contaminated by the sealing agent. For this reason, the electromagnetic shielding function of the shielding member 60 and the exterior member 30 can be suitably maintained.

OTHER EMBODIMENTS

The above embodiment can be implemented with modifications such as the following. The above embodiment and the following variations can be combined with each other as long as no technical contradiction arises.

In the above embodiment, the shielding member 60 and the shield shell 110 are inseparably integrated with each other with use of the rivets 130, but there are no particular limitations on the method of connecting the shielding member 60 and the shield shell 110 to each other.

Figure 6:
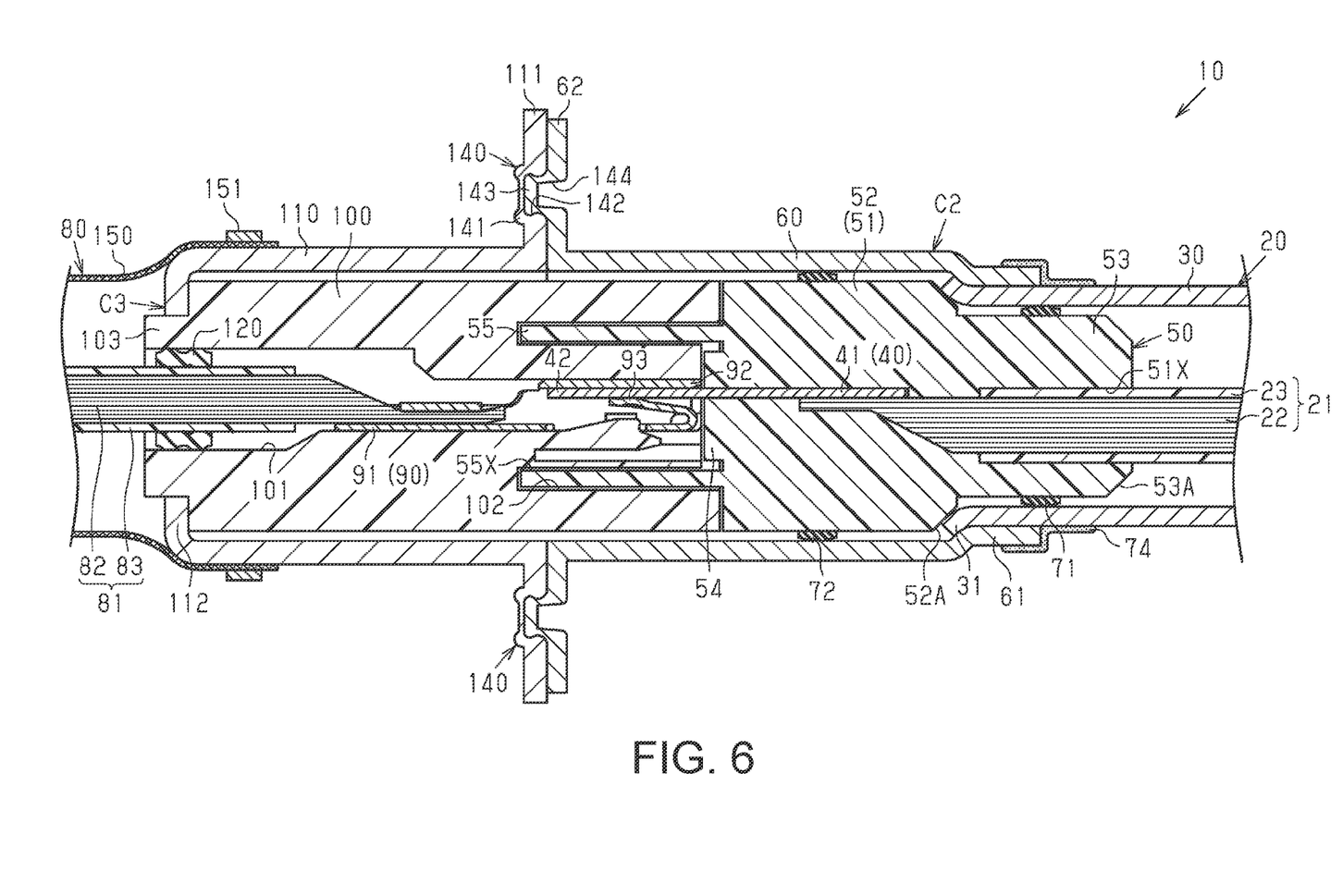
FIG. 6 is a schematic cross-sectional view of a compound wire harness according to a variation.

For example, as shown in FIG. 6, the shielding member 60 and the shield shell 110 may be inseparably integrated by caulking. Specifically, in the compound wire harness 10 of this variation, the shielding member 60 and the shield shell 110 have caulked portions 140. A plurality of caulked portions 140 are provided in the shielding member 60 and the shield shell 110, for example. For example, the caulked portions 140 are provided in the fixing portion 62 and the fixing portion 111. The fixing portion 62 and the fixing portion 111 are caulked in the caulked portions 140. The caulked portions 140 are button-shaped, for example. The caulked portions 140 are formed by a concave-convex structure in which either one of the fixing portions 62 and 111 (here, the fixing portion 62) protrudes toward the other one (here, the fixing portion 111), for example. In the caulked portions 140, the fixing portions 62 and 111 are fitted together and joined together by the concave-convex structure. The concave-convex structure of the caulked portions 140 will be described in detail below. Each of the caulked portions 140 includes a protrusion 141 in which a portion of the fixing portion 111 protrudes forward beyond the front end surface of the fixing portion 111, and a recession 142 in which a portion of the fixing portion 111 is recessed forward beyond the rear end surface of the fixing portion 111. In each of the caulked portions 140, the fixing portion 111 has a portion that is shaped as a bottomed cylinder due to the protrusion 141 and the recession 142. Each of the caulked portions 140 includes a protrusion 143 that is fitted into the recession 142 and is formed by a portion of the fixing portion 62 protruding forward from the front end surface of the fixing portion 62, and a recession 144 in which a portion of the fixing portion 62 is recessed forward from the rear end surface of the fixing portion 62. The outer surface of the protrusion 143 is joined to the inner surface of the recession 142. In each of the caulked portions 140, the fixing portion 62 has a portion that is shaped as a bottomed cylinder due to the protrusion 143 and the recession 144. Each of the caulked portions 140 has a concave-convex structure in which the bottomed cylindrical portion of the fixing portion 62 protrudes toward the bottomed cylindrical portion of the fixing portion 111 and is fitted therein. The shielding member 60 and the shield shell 110 are inseparably integrated with each other by the caulked portions 140.

The caulked portions 140 are formed by crimping the fixing portion 62 and the fixing portion 111 to plastically deform such portions. The caulked portions 140 can be formed by caulking performed by mechanical clinching, for example.

In the variation shown in FIG. 6, the caulked portions 140 have a concave-convex structure in which the fixing portion 62 protrudes toward the fixing portion 111, but the present disclosure is not limited to this. For example, the caulked portions 140 may have a concave-convex structure in which the fixing portion 111 protrudes toward the fixing portion 62.

Alternatively, the shielding member 60 and the shield shell 110 may be inseparably integrated with each other by welding, brazing, or the like.

The structures of the connectors C2 and C3 in the above embodiment can be changed as desired.

In the above embodiment, the connector housing 50 of the connector C2 is formed by insert molding. For example, the connector housing 50 is formed so as to surround the core wire 22, the insulating coating 23, and the terminal 40, in a state of close contact with such members. However, the structure of the connector housing 50 is not limited to this. For example, as long as the connector housing 50 has a structure capable of holding the terminals 40, there are no particular limitations on other aspects of the structure. For example, the inner peripheral surfaces of the through holes 51X of the body portion 51 are not required to be in close contact with the outer peripheral surfaces of the core wires 22, the outer peripheral surfaces of the insulating coatings 23, and the outer peripheral surfaces of the terminals 40. For example, the tubular portion 55 may be omitted. As another example, the protrusion 54 of the body portion 51 may be omitted. As another example, the guide portion 52A of the covering portion 52 may be omitted. As another example, the guide portion 53A of the covering portion 53 may be omitted.

There are no particular limitations on the structure of the exterior member 30 in the above embodiment. For example, the guiding portion 31 may be omitted.

The exterior member 30 of the above embodiment is not limited to being a metal member made of a single material. For example, the exterior member 30 may be a composite member in which an electrically conductive shield layer is laminated on or embedded in a non-metallic pipe body. Also, the exterior member 30 may be embodied as a pipe made of a synthetic resin. Even in this case, the exterior member 30 has a higher rigidity than the exterior member 85.

In the above-described embodiment, the wire harness 20 includes two wires 21, but the present disclosure is not limited to this. The number of wires 21 can be changed according to the specifications of the vehicle V. For example, the number of wires 21 may be one, or may be three or more. For example, a low-voltage wire connecting a low-voltage battery to any of various low-voltage devices (e.g., a lamp or a car audio system) may be added as a wire constituting the wire harness 20.

The wire harness 80 of the above embodiment includes the shielding member 150 that surrounds the wires 81 all together. Alternatively, the wires 81 may be changed to shielded wires, and the shielding member 150 may be omitted, for example.

The wire 81 of the above embodiment has a configuration in which one wire 81A is branched into two wires 81B and 81C inside the exterior member 85. However, there are no particular limitations on the branch position (i.e., the power distribution position) of the wire 81.

Figure 7:
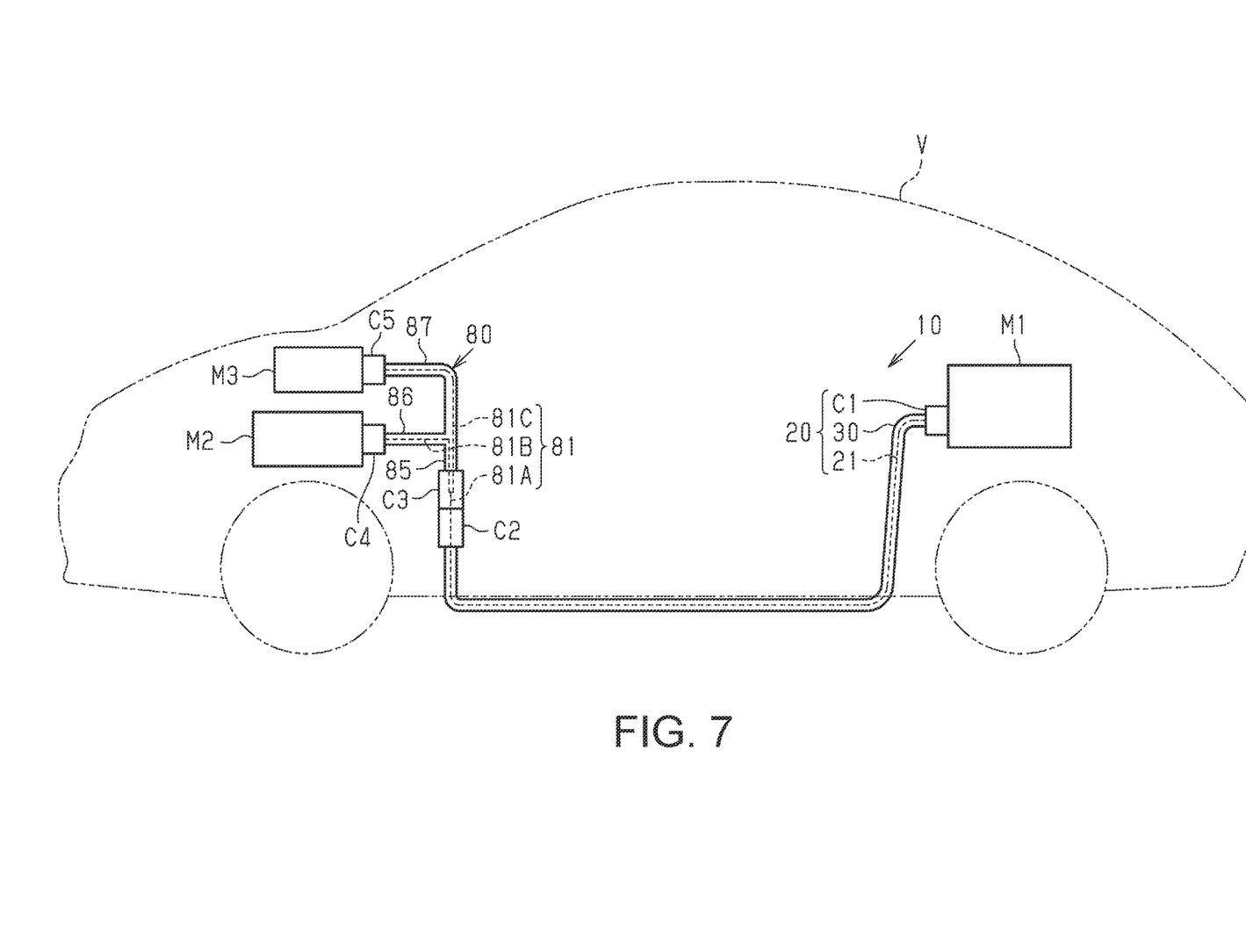
FIG. 7 is a schematic configuration diagram showing a compound wire harness according to a variation.

For example, as shown in FIG. 7, one wire 81A may be branched into two wires 81B and 81C inside the connector C3. In other words, the connector C3 in this case has a power distribution function.

In the wire harness 80 of the above embodiment, one wire 81A is branched into two wires 81B and 81C, but one wire 81A may be branched into three or more wires.

In the above embodiment, the wire harness 80 has a branch structure in which one wire 81A is branched into two wires 81B and 81C. However, the structure of the wire harness 80 is not limited to this, and the branch structure may be omitted from the wire harness 80, for example. In this case, the wire harness 80 electrically connects the wire harness 20 to either one of the in-vehicle devices M2 and M3, for example.

Although the sealing members 71, 72, and 120 are embodied as rubber rings made of rubber in the above embodiment and variations, the present disclosure not limited to this. For example, ring members made of an elastic material other than rubber may be employed as the sealing members 71, 72, and 120.

The sealing members 71, 72, 74, and 120 of the above embodiment and variations may be omitted.

The positional relationship between the battery M1 and the in-vehicle devices M2 and M3 in the vehicle V is not limited to the relationship described in the above embodiment, and may be changed according to the configuration of the vehicle V as appropriate.

As described above, the exterior member 30 has a rigidity capable of maintaining the path of the electric wires 21, and therefore the wire harness 20 may maintain its shape with the rigidity of the wire harness 20 itself. Also, as described above, the wire harness 80 has a higher flexibility than the wire harness 20 and absorbs vibration from the engine or the like, and thus the wire harness 80 may have an extent of flexibility that allows a change in shape due to vibration. The wire harness 20 may be referred to as a rigid wire harness, and the wire harness 80 may be referred to as a flexible wire harness.

As shown in FIG. 3, the shielding member 60 includes an inclined portion between the front end portion of the shielding member 60 and the connection portion 61, and the inclined portion may come into contact with the outer peripheral surface of the guiding portion 31 of the exterior member 30 from the rear side. Furthermore, the inclined portion may be inclined inward in the radial direction so as to be in close contact with the outer peripheral surface of the guiding portion 31.

As shown in FIGS. 2 and 3, a ring-shaped first gap extending completely around the exterior member 30 may be formed between the covering portion 53 and the exterior member 30, and the first sealing member 71 may be arranged in the first gap. Also, a ring-shaped second gap extending completely around the shielding member 60 may be formed between the covering portion 52 and the shielding member 60, and the second sealing member 72 may be arranged in the second gap.

As shown in FIG. 2, the second guide portion 52A (second guide) may come into contact with the inner peripheral surface of the guiding portion 31 from the front side. Also, as shown in FIG. 3 or 6, while the shielding member 60 is inseparably integrated with the shield shell 110, the second guide portion 52A may be in contact with the inner peripheral surface of the guiding portion 31, and the step at the front end portion of the connector housing 100 may be in contact with the engaging portion 112 of the shield shell 110. Note that the shielding member 60 may be referred to as a bracket or a first shielding member, and the shield shell 110 may be referred to as a second shielding member.

The present disclosure encompasses implementation examples such as the following. Some constituent elements of the following exemplary embodiments are denoted by reference signs as an aid to understanding and not for limitation. Portions of the matter described in the following implementation examples may be omitted, and portions of the matter described in the following implementation examples may be selected or extracted and combined with each other.

Supplementary Note 1

In an aspect of the present disclosure,
the first wire harness (20) may have a rigidity capable of maintaining a shape of the first wire harness (20), and
the second wire harness (80) may have a flexibility capable of absorbing vibration.

Supplementary Note 2

In an aspect of the present disclosure,
with a front side of the compound wire harness (10) being a side closer to an in-vehicle device (M2, M3), and a rear side of the compound wire harness (10) being a side farther from the in-vehicle device (M2, M3),
a front end portion of the first exterior member (30) may include a guiding portion (31) inclined to extend away from the first wire (21) while extending toward the front side,
a rear end portion of the shielding member (60) may include:
an inclined portion inclined to approach the first wire (21) while extending toward the rear side; and
a connection portion (61) continuous with the inclined portion and configured to be fitted around the first exterior member (30), and
the inclined portion may engage with an outer peripheral surface of the guiding portion (31) from the rear side.

Supplementary Note 3

In an aspect of the present disclosure,
the shield shell (110) may include an engaging portion (112) protruding inward in a radial direction of the shield shell (110) from a front end portion of the shield shell (110), and
while the shielding member (60) is inseparably integrated with the shield shell (110), the second guide portion (52A) may be in contact with an inner peripheral surface of the guiding portion (31), and a front end portion of the second connector housing (100) may be in contact with the engaging portion (112).

The embodiments disclosed herein are intended to be considered as examples in all respects and not restrictive. The scope of the present disclosure is indicated by the scope of the claims rather than the meaning described above, and is intended to include all changes within the meaning and scope equivalent to the scope of the claims.

The invention claimed is:

1. A compound wire harness for installation in a vehicle, the compound wire harness comprising:
   a first wire harness; and
   a second wire harness configured to be electrically connected to an in-vehicle device and electrically connected to the first wire harness, wherein:
   the first wire harness includes:
      a first wire including a first core wire and a first insulating coating covering the first core wire;
      a first terminal attached to an end of the first core wire;
      a first connector housing covering the first core wire, the first insulating coating, and the first terminal;
      a first exterior ring that is ring-shaped and surrounds the first wire; and
      a shield that is ring-shaped and electrically conductive, and is attached to a lengthwise end of the first exterior ring,
   the second wire harness includes:
      a second wire including a second core wire and a second insulating coating covering the second core wire;
      a second terminal attached to an end of the second core wire and configured to be electrically connected to the first terminal;
      a second connector housing holding the second terminal;
      a shield shell that is ring-shaped and electrically conductive, and surrounds the second connector housing; and
      a second exterior ring that is ring-shaped and surrounds the second wire,
   the first exterior ring and the shield have a higher rigidity than the second exterior ring,
   the first connector housing is surrounded by the first exterior ring and the shield, and
   the shield is inseparably integrated with the shield shell.

2. The compound wire harness according to claim 1, further comprising:
   a rivet passing through the shield and the shield shell,
   wherein the rivet inseparably integrates the shield and the shield shell.

3. The compound wire harness according to claim 1, further comprising:
   a caulked portion in which the shield and the shield shell are caulked,
   wherein the caulked portion inseparably integrates the shield and the shield shell.

4. The compound wire harness according to claim 1, further comprising:
   a first seal that is ring-shaped and attached to an outer peripheral surface of the first connector housing,
   wherein the first seal is in close contact with the outer peripheral surface of the first connector housing and is in close contact with an inner peripheral surface of the first exterior ring.

5. The compound wire harness according to claim 1, further comprising:
   a second seal that is ring-shaped and attached to an outer peripheral surface of the first connector housing,
   wherein the second seal is in close contact with the outer peripheral surface of the first connector housing and is in close contact with an inner peripheral surface of the shield.

6. The compound wire harness according claim 1, further comprising:
   a third seal covering an outer peripheral surface of the first exterior ring and an outer peripheral surface of the shield, in a state of close contact,
   wherein the third seal extends across a region spanning the outer peripheral surface of the first exterior ring and the outer peripheral surface of the shield.

7. The compound wire harness according to claim 1, wherein:
   the first connector housing includes:
      a first end on a side corresponding to the first terminal; and
      a second end on a side opposite to the first end, and
   an outer peripheral surface of the second end includes a first guide inclined to approach the first wire while extending away from the first end.

8. The compound wire harness according to claim 7, wherein:
   a lengthwise end of the shield is fitted around a lengthwise end of the first exterior ring,
   the first connector housing includes:
      a first cover-accommodated inside the first exterior ring; and
      a second cover-accommodated inside the shield, and
   the second cover has a larger outer shape than the first cover, the outer shape of the second cover being set to a size according to which the second cover is not insertable into the first exterior ring.

9. The compound wire harness according to claim 8, wherein:
   the first cover includes the first guide, and
   an outer peripheral surface of an end of the second cover that is connected to the first cover includes a second guide inclined to approach the first wire while extending toward the first cover.

* * * * *